(12) United States Patent
Chan

(10) Patent No.: US 9,154,077 B2
(45) Date of Patent: Oct. 6, 2015

(54) COMPACT HIGH FREQUENCY DIVIDER

(75) Inventor: Ngar Loong A. Chan, Santa Clara, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 13/445,075

(22) Filed: Apr. 12, 2012

(65) Prior Publication Data

US 2013/0271188 A1    Oct. 17, 2013

(51) Int. Cl.
H03B 19/06    (2006.01)
H03B 19/14    (2006.01)
H03K 3/356    (2006.01)
H03K 21/02    (2006.01)
H03K 21/10    (2006.01)

(52) U.S. Cl.
CPC ............ *H03B 19/14* (2013.01); *H03K 3/35613* (2013.01); *H03K 21/026* (2013.01); *H03K 21/10* (2013.01)

(58) Field of Classification Search
USPC ........................................................ 327/118
See application file for complete search history.

(56) References Cited

U.S. PATENT DOCUMENTS

| 4,061,882 A | 12/1977 | Dorren |
| 4,333,020 A | 6/1982 | Maeder |
| 4,555,777 A | 11/1985 | Poteet |
| 4,623,801 A | 11/1986 | Rocchi |
| 4,716,320 A | 12/1987 | McAdams |
| 4,959,557 A | 9/1990 | Miller |
| 4,995,589 A | 2/1991 | Adishian et al. |
| 5,097,157 A | 3/1992 | Jaffe et al. |
| 5,103,114 A | 4/1992 | Fitch |
| 5,103,116 A | 4/1992 | Sivilotti et al. |
| 5,103,144 A | 4/1992 | Dunham |
| 5,192,875 A | 3/1993 | Kielmeyer, Jr. |
| 5,375,258 A | 12/1994 | Gillig |
| 5,477,180 A | 12/1995 | Chen |
| 5,534,803 A | 7/1996 | Correale, Jr. et al. |

(Continued)

FOREIGN PATENT DOCUMENTS

| CN | 1412947 A | 4/2003 |
| CN | 1904773 A | 1/2007 |

(Continued)

OTHER PUBLICATIONS

MCGraw-Hill Dictionary of Scientific and Technical Terms, 2003, Sixth Edition , p. 1429.*

(Continued)

*Primary Examiner* — Lincoln Donovan
*Assistant Examiner* — Patrick Chen
(74) *Attorney, Agent, or Firm* — Peter A. Clevenger

(57) ABSTRACT

A frequency divider circuit having two stages of transistors has improved performance at low supply voltages. The circuit may include cross-coupled PMOS and NMOS transistors, in which the input signal to be frequency divided is supplied to the body of the PMOS and/or NMOS transistors. The input signal may be coupled to the PMOS and/or NMOS transistors through capacitive or inductive coupling. The input signal to the PMOS and/or NMOS transistors may be generated by a voltage controlled oscillator circuit. With the frequency divider circuit having inputs signals coupled to the body of the PMOS and/or NMOS transistors supply voltages as low as 0.5 Volts may be possible.

21 Claims, 7 Drawing Sheets

(56) References Cited

U.S. PATENT DOCUMENTS

| | | | |
|---|---|---|---|
| 5,682,109 A | 10/1997 | Ohmi et al. |
| 5,708,399 A | 1/1998 | Fujii et al. |
| 5,983,082 A | 11/1999 | Hilbert |
| 5,994,935 A | 11/1999 | Ueda et al. |
| 6,014,047 A | 1/2000 | Dreps et al. |
| 6,037,816 A | 3/2000 | Yamauchi |
| 6,057,823 A | 5/2000 | Aoki et al. |
| 6,166,571 A | 12/2000 | Wang |
| 6,169,434 B1 | 1/2001 | Portmann |
| 6,188,291 B1 | 2/2001 | Gopinathan et al. |
| 6,191,629 B1 | 2/2001 | Bisanti et al. |
| 6,239,640 B1 | 5/2001 | Liao et al. |
| 6,310,501 B1 | 10/2001 | Yamashita |
| 6,316,987 B1 | 11/2001 | Dally et al. |
| 6,320,418 B1 | 11/2001 | Fujii et al. |
| 6,320,438 B1 | 11/2001 | Arcus |
| 6,420,921 B1 | 7/2002 | Okayasu et al. |
| 6,426,660 B1 | 7/2002 | Ho et al. |
| 6,433,589 B1 | 8/2002 | Lee |
| 6,542,015 B2 | 4/2003 | Zhou et al. |
| 6,593,789 B2 | 7/2003 | Atallah et al. |
| 6,661,269 B2 | 12/2003 | Simon et al. |
| 6,667,703 B1 | 12/2003 | Reuveni et al. |
| 6,674,772 B1 | 1/2004 | Dally et al. |
| 6,831,497 B2 | 12/2004 | Koh et al. |
| 6,836,240 B1 | 12/2004 | Dubbert et al. |
| 6,897,696 B2 | 5/2005 | Chang |
| 6,904,538 B2 | 6/2005 | Glas et al. |
| 6,933,759 B1 | 8/2005 | Wu et al. |
| 6,967,514 B2 | 11/2005 | Kizer et al. |
| 6,995,589 B2 | 2/2006 | Chen et al. |
| 7,027,793 B2 | 4/2006 | Gard |
| 7,075,377 B2 | 7/2006 | Metaxakis |
| 7,099,643 B2 | 8/2006 | Lin |
| 7,110,469 B2 | 9/2006 | Shi et al. |
| 7,184,512 B2 | 2/2007 | Takeshita et al. |
| 7,239,209 B2 | 7/2007 | Adan |
| 7,271,622 B2 | 9/2007 | Metaxakis |
| 7,298,222 B2 | 11/2007 | Rosik et al. |
| 7,307,461 B2 | 12/2007 | Nguyen et al. |
| 7,315,220 B1 | 1/2008 | Robinson et al. |
| 7,323,944 B2 | 1/2008 | Florescu et al. |
| 7,336,114 B2 | 2/2008 | Razavi et al. |
| 7,352,229 B1 | 4/2008 | Mei et al. |
| 7,388,416 B2 | 6/2008 | Marutani |
| 7,423,468 B2 | 9/2008 | Cho |
| 7,457,605 B2 | 11/2008 | Thompson et al. |
| 7,474,715 B1 | 1/2009 | Ni et al. |
| 7,521,976 B1 | 4/2009 | Sudjian et al. |
| 7,545,230 B2 * | 6/2009 | Jang et al. ............... 331/177 V |
| 7,554,380 B2 | 6/2009 | Embabi et al. |
| 7,580,483 B2 | 8/2009 | Ibrahim et al. |
| 7,603,094 B2 | 10/2009 | Rahman et al. |
| 7,616,938 B2 | 11/2009 | Behzad et al. |
| 7,619,456 B2 | 11/2009 | Kim et al. |
| 7,656,205 B2 * | 2/2010 | Chen et al. ................ 327/115 |
| 7,683,682 B1 | 3/2010 | Won et al. |
| 7,693,230 B2 | 4/2010 | Sorrells et al. |
| 7,715,836 B2 | 5/2010 | Vassiliou et al. |
| 7,750,708 B2 * | 7/2010 | Gschier ...................... 327/238 |
| 7,750,749 B2 | 7/2010 | Jones |
| 7,768,330 B2 | 8/2010 | Yuuki et al. |
| 7,808,329 B2 | 10/2010 | Azadet et al. |
| 7,821,315 B2 | 10/2010 | Bossu et al. |
| 7,932,844 B1 | 4/2011 | Huynh et al. |
| 7,965,111 B2 | 6/2011 | Sun et al. |
| 8,095,103 B2 | 1/2012 | Asuri |
| 8,164,361 B2 | 4/2012 | Soltanian et al. |
| 8,193,835 B1 * | 6/2012 | Wong et al. .................. 327/52 |
| 8,248,132 B2 | 8/2012 | Chang |
| 8,829,966 B2 * | 9/2014 | Chang et al. ............... 327/291 |
| 8,854,098 B2 | 10/2014 | Yang et al. |
| 2001/0050583 A1 | 12/2001 | Fulkerson |
| 2002/0000834 A1 | 1/2002 | Ooishi |
| 2002/0079938 A1 | 6/2002 | Saeki |
| 2002/0113270 A1 | 8/2002 | Bernstein et al. |
| 2002/0160740 A1 | 10/2002 | Hatcher et al. |
| 2003/0042957 A1 | 3/2003 | Tamura |
| 2003/0042989 A1 | 3/2003 | Sakurai |
| 2003/0102926 A1 | 6/2003 | Hsieh |
| 2004/0008092 A1 | 1/2004 | Hajimiri et al. |
| 2004/0036541 A1 | 2/2004 | Fang et al. |
| 2004/0051397 A1 | 3/2004 | Juntunen et al. |
| 2004/0147238 A1 | 7/2004 | Wang et al. |
| 2004/0212741 A1 | 10/2004 | Hijikata et al. |
| 2005/0024097 A1 | 2/2005 | Sim et al. |
| 2005/0046494 A1 | 3/2005 | Lee et al. |
| 2005/0122149 A1 | 6/2005 | Cho et al. |
| 2005/0174157 A1 | 8/2005 | Calo et al. |
| 2006/0035617 A1 | 2/2006 | Kim |
| 2006/0059376 A1 | 3/2006 | Ngo et al. |
| 2006/0067424 A1 | 3/2006 | Wolf |
| 2006/0119446 A1 | 6/2006 | Li et al. |
| 2007/0037544 A1 | 2/2007 | Heikkinen |
| 2007/0076832 A1 | 4/2007 | Matsudera |
| 2007/0239319 A1 | 10/2007 | Inukai et al. |
| 2007/0242548 A1 | 10/2007 | Tonti et al. |
| 2007/0257742 A1 | 11/2007 | Cha et al. |
| 2007/0273485 A1 | 11/2007 | Balachandran et al. |
| 2007/0285120 A1 | 12/2007 | Venditti et al. |
| 2008/0001645 A1 | 1/2008 | Kuroki |
| 2008/0032646 A1 | 2/2008 | Huang et al. |
| 2008/0048736 A1 | 2/2008 | Ruy |
| 2008/0071894 A1 | 3/2008 | Raita et al. |
| 2008/0074148 A1 * | 3/2008 | Srivastava et al. ............... 326/68 |
| 2008/0096508 A1 | 4/2008 | Luff |
| 2008/0106313 A1 | 5/2008 | Keady et al. |
| 2008/0116902 A1 | 5/2008 | Kim et al. |
| 2008/0132195 A1 | 6/2008 | Maxim et al. |
| 2008/0180139 A1 | 7/2008 | Natonio et al. |
| 2008/0225169 A1 | 9/2008 | Takita et al. |
| 2008/0231379 A1 | 9/2008 | Jang et al. |
| 2008/0258781 A1 | 10/2008 | Song et al. |
| 2009/0033430 A1 | 2/2009 | Jang et al. |
| 2009/0066157 A1 | 3/2009 | Tarng et al. |
| 2009/0102520 A1 * | 4/2009 | Lee et al. ...................... 327/115 |
| 2009/0108885 A1 | 4/2009 | Natonio et al. |
| 2009/0131006 A1 | 5/2009 | Wu |
| 2009/0154595 A1 | 6/2009 | Choksi et al. |
| 2009/0156135 A1 | 6/2009 | Kamizuma et al. |
| 2009/0184741 A1 | 7/2009 | Suda et al. |
| 2009/0256596 A1 | 10/2009 | Oh |
| 2009/0284288 A1 | 11/2009 | Zhang et al. |
| 2009/0284311 A1 | 11/2009 | Ito |
| 2009/0310711 A1 | 12/2009 | Chiu et al. |
| 2010/0012648 A1 | 1/2010 | Gustafsson et al. |
| 2010/0120390 A1 | 5/2010 | Panikkath et al. |
| 2010/0130139 A1 | 5/2010 | Panikkath et al. |
| 2010/0194485 A1 * | 8/2010 | Chawla et al. .......... 331/117 FE |
| 2010/0198540 A1 | 8/2010 | Yanagisawa et al. |
| 2010/0226459 A1 | 9/2010 | Park et al. |
| 2011/0001522 A1 * | 1/2011 | Chan et al. ................... 327/118 |
| 2011/0012648 A1 | 1/2011 | Qiao et al. |
| 2011/0043291 A1 * | 2/2011 | Fagg ............................ 331/46 |
| 2011/0050296 A1 | 3/2011 | Fagg |
| 2011/0181330 A1 | 7/2011 | Oh |
| 2013/0012150 A1 | 1/2013 | Panikkath et al. |
| 2013/0328707 A1 | 12/2013 | Choksi et al. |
| 2013/0336143 A1 | 12/2013 | Choksi et al. |

FOREIGN PATENT DOCUMENTS

| | | |
|---|---|---|
| EP | 0398751 A2 | 11/1990 |
| EP | 0637134 A1 | 2/1995 |
| EP | 0872956 A2 | 10/1998 |
| EP | 1345317 A2 | 9/2003 |
| EP | 1394944 | 3/2004 |
| EP | 1416691 A1 | 5/2004 |
| EP | 1655591 A1 | 5/2006 |
| EP | 1679796 A1 | 7/2006 |
| FR | 2670975 A1 | 6/1992 |
| GB | 2321144 A | 7/1998 |
| JP | 53048401 A | 5/1978 |
| JP | 59008112 A | 1/1984 |

(56) References Cited

FOREIGN PATENT DOCUMENTS

| | | | |
|---|---|---|---|
| JP | 62141219 U | 9/1987 | |
| JP | 63078610 A | 4/1988 | |
| JP | H0194723 A | 4/1989 | |
| JP | H01314013 A | 12/1989 | |
| JP | 2058951 A | 2/1990 | |
| JP | 2060330 U | 5/1990 | |
| JP | 2131615 A | 5/1990 | |
| JP | H03262317 A | 11/1991 | |
| JP | H04152711 A | 5/1992 | |
| JP | H05235746 A | 9/1993 | |
| JP | 5268000 A | 10/1993 | |
| JP | 7170162 A | 7/1995 | |
| JP | 9046195 A | 2/1997 | |
| JP | 9191238 A | 7/1997 | |
| JP | H09284125 A | 10/1997 | |
| JP | 10111674 A | 4/1998 | |
| JP | 10247842 A | 9/1998 | |
| JP | H11298077 A | 10/1999 | |
| JP | 2000295090 A | 10/2000 | |
| JP | 2000332583 A | 11/2000 | |
| JP | 2001245007 A | 9/2001 | |
| JP | 2001312328 A | 11/2001 | |
| JP | 2001313228 A | 11/2001 | |
| JP | 2002043900 A | 2/2002 | |
| JP | 2002064367 A | 2/2002 | |
| JP | 2003101397 A | 4/2003 | |
| JP | 2003512752 A | 4/2003 | |
| JP | 2003224471 A | 8/2003 | |
| JP | 2004129255 A | 4/2004 | |
| JP | 2004531126 A | 10/2004 | |
| JP | 2004336812 A | 11/2004 | |
| JP | 2005110080 A | 4/2005 | |
| JP | 2006093748 A | 4/2006 | |
| JP | 2006115148 A | 4/2006 | |
| JP | 2006173897 A | 6/2006 | |
| JP | 2006217563 A | 8/2006 | |
| JP | 2006287819 A | 10/2006 | |
| JP | 2006314029 A | 11/2006 | |
| JP | 2007102483 A | 4/2007 | |
| JP | 2008029008 A | 2/2008 | |
| JP | 2008054134 A | 3/2008 | |
| JP | 2008124836 A | 5/2008 | |
| JP | 2010-003925 A | * | 1/2010 |
| JP | 2010003925 A | * | 1/2010 |
| JP | 5235746 B2 | 7/2013 | |
| KR | 20050055925 A | 6/2005 | |
| KR | 100791934 B1 | 1/2008 | |
| KR | 20080019156 A | 3/2008 | |
| TW | 200305312 A | 10/2003 | |
| TW | 200529566 | 9/2005 | |
| TW | 200723676 | 6/2007 | |
| TW | I283515 B | 7/2007 | |
| WO | WO9621270 A1 | 7/1996 | |
| WO | WO9912259 A2 | 3/1999 | |
| WO | WO0129965 A1 | 4/2001 | |
| WO | WO0251091 A1 | 6/2002 | |
| WO | 02052691 A1 | 7/2002 | |
| WO | 2004047324 A1 | 6/2004 | |
| WO | WO2006033203 A1 | 3/2006 | |
| WO | WO2009036397 | 3/2009 | |
| WO | WO2009036399 | 3/2009 | |
| WO | WO2010068504 | 6/2010 | |

OTHER PUBLICATIONS

Chan, "Hercules (RTR9800) Divider", Aug. 2005.
Co-pending U.S. Appl. No. 13/011,716, filed Jan. 21, 2011.
Navid S et al., "Level-Locked Loop: A Technique for Broadband Quadrature Signal Generation", Custom Integrated Circuits Conference, 1997., Proceedings of the IEEE 1997 Santa Clara, CA, USA May 5-8, 1997, New York, NY, USA,IEEE, US, May 5, 1997, pp. 411-414, XP010235334, DOI: 10.1109/CICC.1997.606656 ISBN: 978-0-7803-3669-8.
Roufoogaran R, et al., "A compact and power efficient local oscillator generation and distribution system for complex multi radio systems" Radio Frequency Integrated Circuits Symposium, 2008. RFIC 2008. IEEE, IEEE, Piscataway, NJ, USA, Jun. 17, 2008, pp. 277-280, XP031284334 ISBN: 978-1-4244-1808-4 *Section 111. Detailed Description*; p. 277-p. 279.
Chan, et al., "Hercules (RTR9800) Divider", Aug. 2005.
Fuse, T et al: "A 1.1V SOI CMOS Frequency Divider Using Body-Inputting SCL Circuit Technology", 2000 IEEE International SOI Conference Proceedings. Wakefield, MA, Oct. 2-5, 2000; [IEEE International SOI Conference], New York, NY : IEEE, US, Oct. 2, 2000, p. 106-107, XP001003452, ISBN: 978-0-7803-6390-8 p. 106; figure 3.
International Search Report and Written Opinion—PCT/US2013/036251—ISA/EPO—Jul. 19, 2013.
Lee, T.H., et al., "A 2.5 V CMOS delay-locked loop for 18 Mbit, 500 megabyte/s DRAM," Solid-State Circuits, IEEE Journal of, vol. 29, No. 12, pp. 1491-1496, Dec. 1994.

* cited by examiner

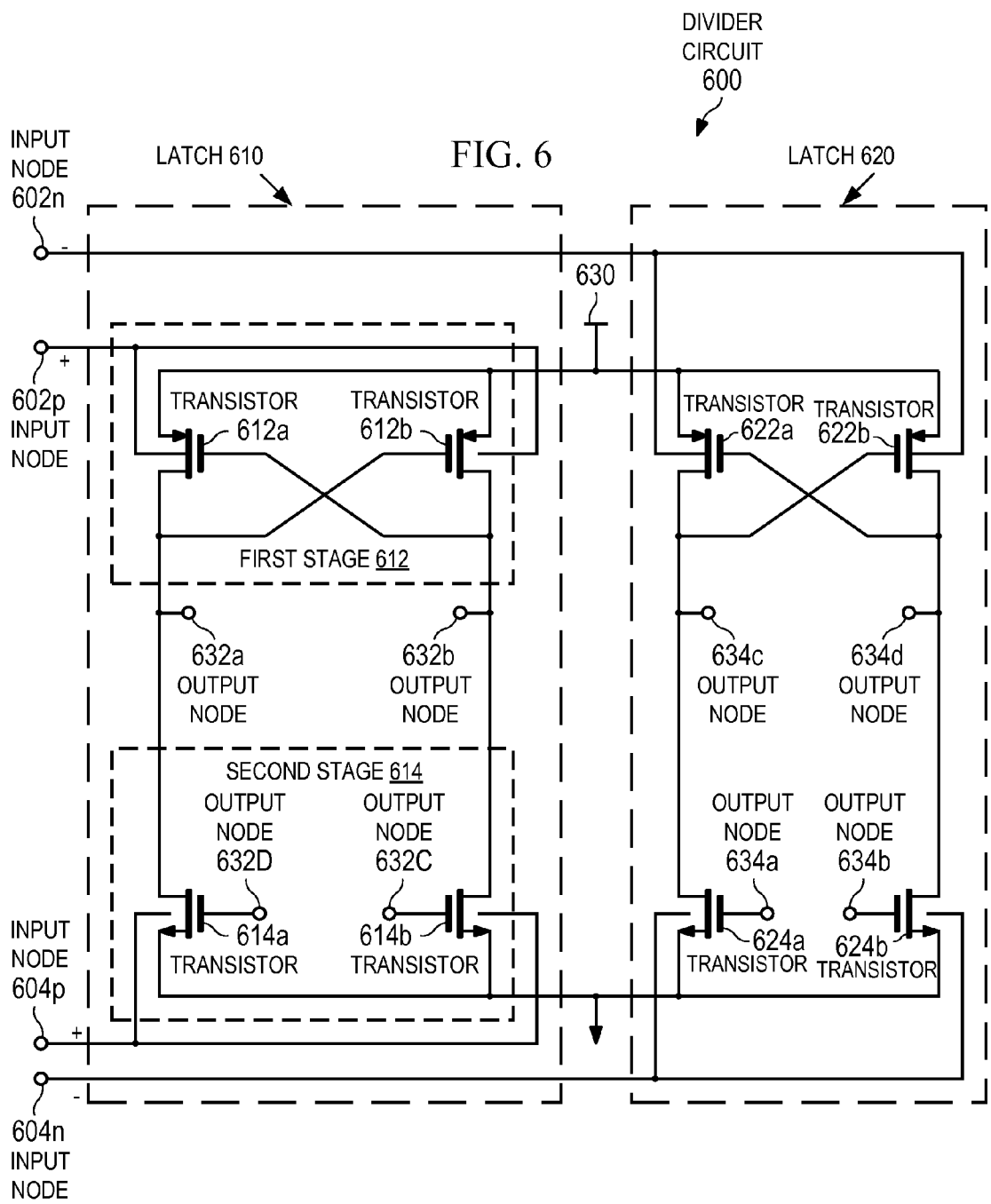

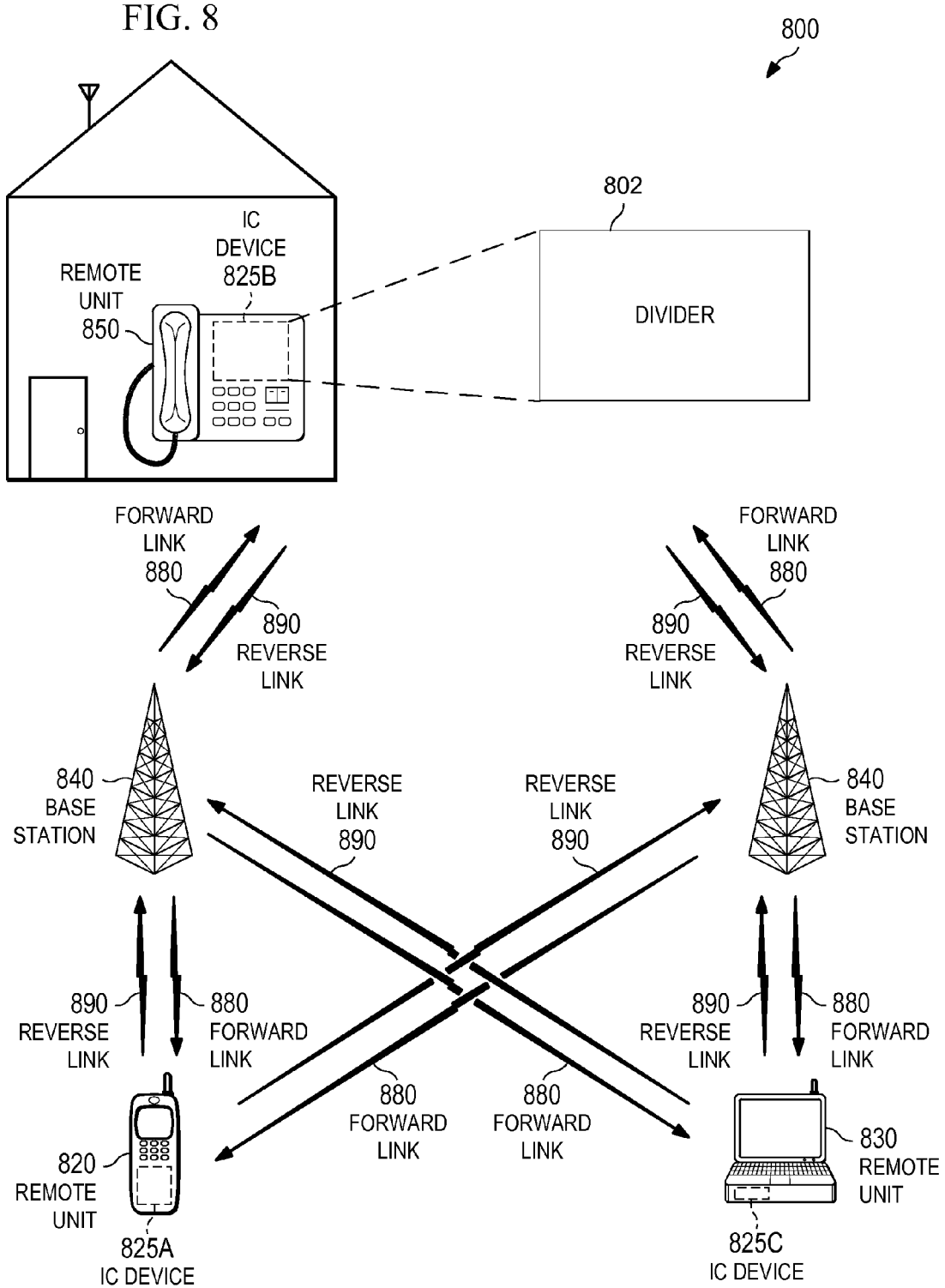

COMPACT HIGH FREQUENCY DIVIDER

TECHNICAL FIELD

The present disclosure generally relates to electronic circuits. The present disclosure more specifically relates to frequency divider circuits.

BACKGROUND

Frequency dividers are an integral part of communications integrated circuits (ICs), particularly for broadband applications. As technology advances, ICs are manufactured with smaller transistors, and lower supply voltages are provided to the ICs. However, the lower supply voltages may cause problems for many conventional frequency divider circuits.

One common and conventional frequency divider is referred to as a current mode logic (CML) divider circuit. CML dividers include resistors that generate a voltage drop. Increasing the gain and decreasing the swing time of a CML divider is achieved at the expense of increased voltage drop across the resistors, which restricts the lowest operational supply voltage for a CML divider.

One alternative is a divider circuit having flip-flops that are biased to create operation points based on the input frequency of the signal being divided, such as disclosed in U.S. Pat. No. 7,683,682 to Won. Won discloses a body bias generator, for NMOS and PMOS transistors in the divider circuit, that generates a bias voltage based on a difference between a frequency of an input signal for dividing and a frequency of an internal reference signal. The input signal is coupled to a gate terminal of transistors in the flip-flops. The bias voltage is then applied to the body input of the PMOS and NMOS transistors to decrease power consumption by the transistors when the input signal has a low frequency and increase operation speed of the transistors when the input signal has a high frequency. The divider circuit of Won allows scaling of power consumption by the transistors when demand on the transistors is lower, however the body biasing of Won does not allow a reduction in operational supply voltage for the divider.

Another alternative for low supply voltage divider circuits includes dividers referred to as injection lock dividers. However, injection lock dividers occupy large die areas and are bandwidth-limited in operation. Thus, they are generally not suitable for broadband applications.

BRIEF SUMMARY

According to one embodiment, an apparatus that includes at least two NMOS transistors and at least two PMOS transistors, each of the PMOS transistors coupled to one of the NMOS transistors. The apparatus further includes a cross-coupled pair of transistors where either the NMOS transistors or the PMOS transistors are the cross-coupled pair. The apparatus also includes an input node for receiving an input signal, where the input node is coupled to a body of the non cross-coupled pair of transistors.

According to a further embodiment, an apparatus that includes means for dividing an input signal from a first frequency to a second frequency, means for receiving an input signal coupled to a body input of the dividing means, and means for coupling the input signal to the dividing means.

According to yet another embodiment, a method that includes receiving an input signal with a first frequency at a body input of a first pair of transistors, dividing the input signal to a second frequency with a second pair of transistors by holding an output of the first pair of transistors for two cycles of the input signal, and generating an output signal at the second frequency.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 6 is a circuit schematic of a frequency divider circuit having an input signal coupled to a body terminal of PMOS transistors and a body terminal of NMOS transistors according to one embodiment of the disclosure.

FIG. 8 is a block diagram showing an exemplary wireless communication system in which an embodiment of the disclosure may be advantageously employed.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The word "exemplary" is used herein to mean "serving as an example, instance, or illustration." Any embodiment or aspect described herein as "exemplary" is not necessarily to be construed as preferred or advantageous over other embodiments or aspects. In addition, references to "an," "one," "other," or "various" embodiments or aspects should not be construed as limiting since various aspects of the disclosed embodiments may be used interchangeably within other embodiments.

Frequency divider circuits having input signals provided to a body terminal (alternatively referred to as a back gate, a substrate terminal, a base terminal, or a bulk terminal) of the transistors, rather than the gate terminal, have several advantages to conventional frequency divider circuits. For example, coupling inputs to the body of the transistors reduces the stacking of transistors to as little as two stages in the frequency divider circuit. Further, coupling inputs to the body of the transistors decreases variation between circuits resulting from process variation. Additionally, coupling inputs to the body of the transistors reduces power consumption. According to one embodiment, a frequency divider circuit having input signals provided to the body of the transistors may be operated to divide frequency signals in half at input frequencies of up to and exceeding 20 GHz and at supply voltages as low as, and possibly lower than 0.5 volts.

Figure 1:
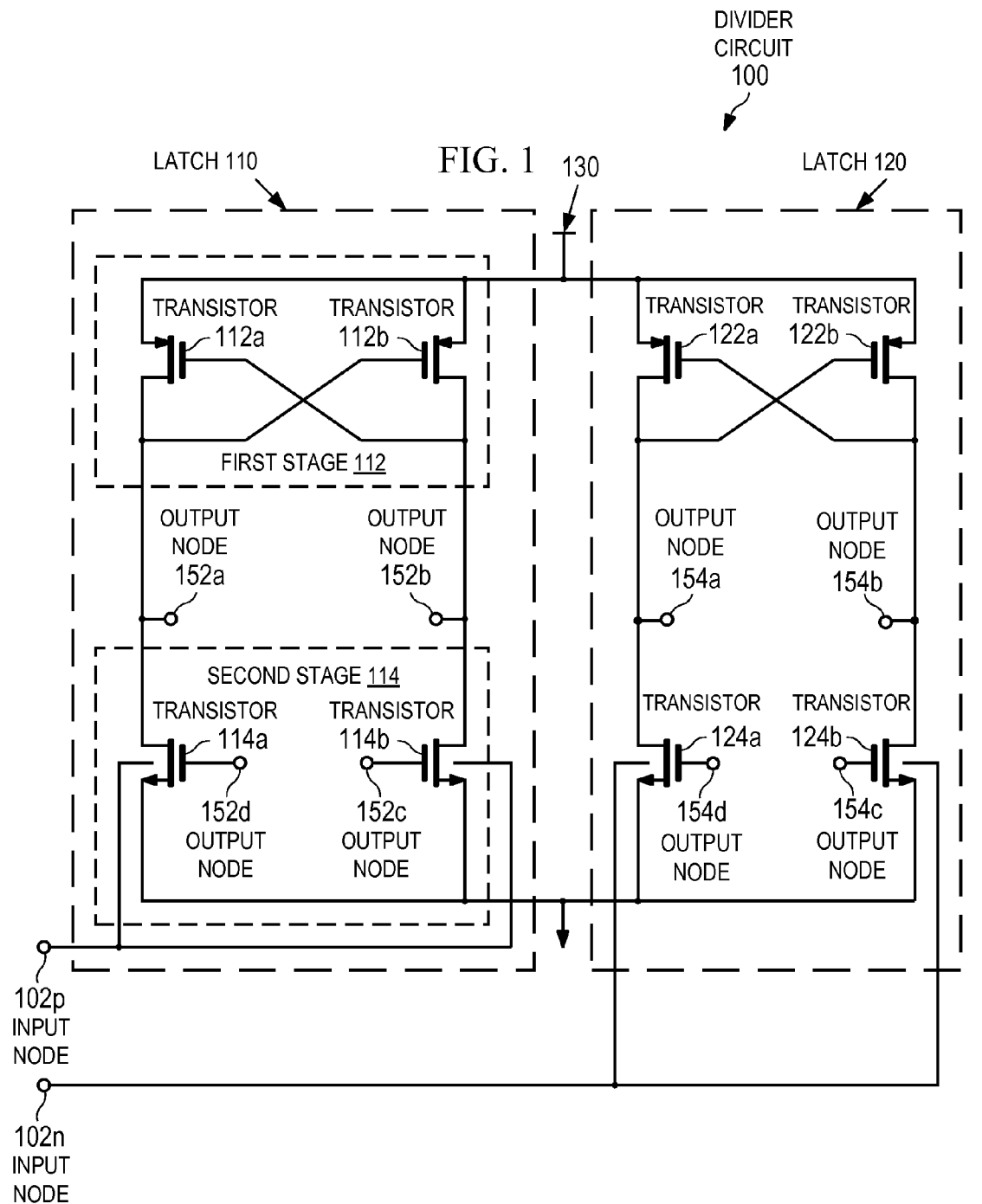
FIG. 1 is a circuit schematic of a frequency divider circuit having an input signal coupled to a body terminal of NMOS transistors according to one embodiment of the disclosure.

FIG. 1 is a circuit schematic of a frequency divider circuit 100 having an input node 102p coupled to NMOS transistors 114a-b according to one embodiment of the disclosure. A divider circuit 100 may include input nodes 102p and 102n. The input nodes 102p and 102n may be components of a differential signal. In a differential configuration, the divider circuit 100 may include latches 110 and 120 coupled to the input nodes 102p and 102n, respectively. The latch 110 may include a first stage of transistors 112 and a second stage of transistors 114. The first stage 112 and the second stage 114 may include transistors 112a-b and 114a-b, respectively The latch 120 may have the same configuration as the latch 110, however the latch 120 may receive input from the second input node 102n. According to one embodiment, there may be a single latch with a single input node for a non-differential configuration.

The transistors 112a-b may be a pair of cross-coupled PMOS transistors. The cross-coupling may be achieved by coupling a gate terminal of the transistor 112a to a source/drain terminal of the transistor 112b and the transistor 114b. Likewise, a gate terminal of the transistor 112b may be coupled to a source/drain terminal of the transistor 112a and the transistor 114a. The input node 102p may be coupled to a body of the NMOS transistor 114a-b. According to one embodiment, the NMOS transistors 114a-b may be constructed in an isolation well with, for example, p-well isolation technology such as a deep n-well. An output from the divider circuit 100 may be obtained at output nodes 152a-b and 152c-d. The output nodes 152a-b may provide in-phase output, and the output nodes 152c-d may provide quadrature phase output.

Figure 2:
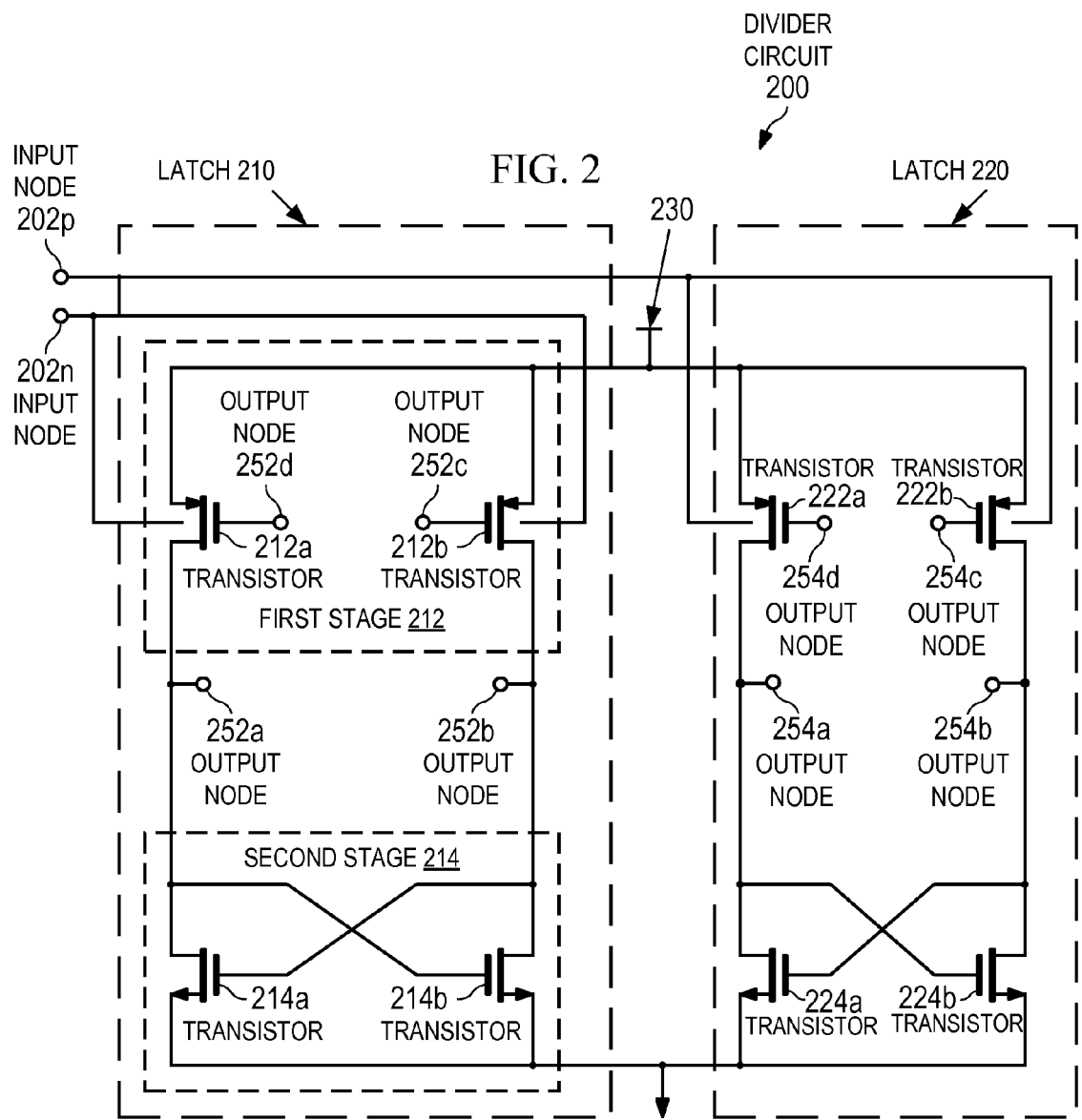
FIG. 2 is a circuit schematic of a frequency divider circuit having an input signal coupled to a body terminal of PMOS transistors according to one embodiment of the disclosure.

FIG. 2 is a circuit schematic of a frequency divider circuit 200 having an input node 202n coupled to PMOS transistors 212a-b according to one embodiment of the disclosure. A circuit 200 may include a first latch 210 and a second latch 220. Each of the latches 210, 220 may perform frequency division on one of the differential signals received through the input nodes 202n and 202p. The first latch 210 includes a first stage of transistors 212 and a second stage of transistors 214.

The first stage 212 may include NMOS transistors 212a-b, of which the input node 202n may be coupled to the body thereof. The second stage 214 may include cross-coupled transistors 214a-b. The NMOS transistors 214a-b may be cross-coupled such that a gate terminal of the transistor 214a may be coupled to a source/drain terminal of the NMOS transistor 214b and the PMOS transistor 212b, and a gate terminal of the NMOS transistor 214b may be coupled to a source/drain terminal of the NMOS transistor 214a and the PMOS transistor 212a.

The frequency divider circuits of FIG. 1 and FIG. 2 may be operated at low supply voltages. For example, the frequency divider circuits 100 and 200 may be operated between 0.5 Volts and 1.1 Volts. However, the circuits 100 and 200 may also be operated at higher or lower supply voltages. According to one embodiment, the transistors of the divider circuits 100 and 200 may be manufactured with 28 nm fabrication technology.

Figure 3:
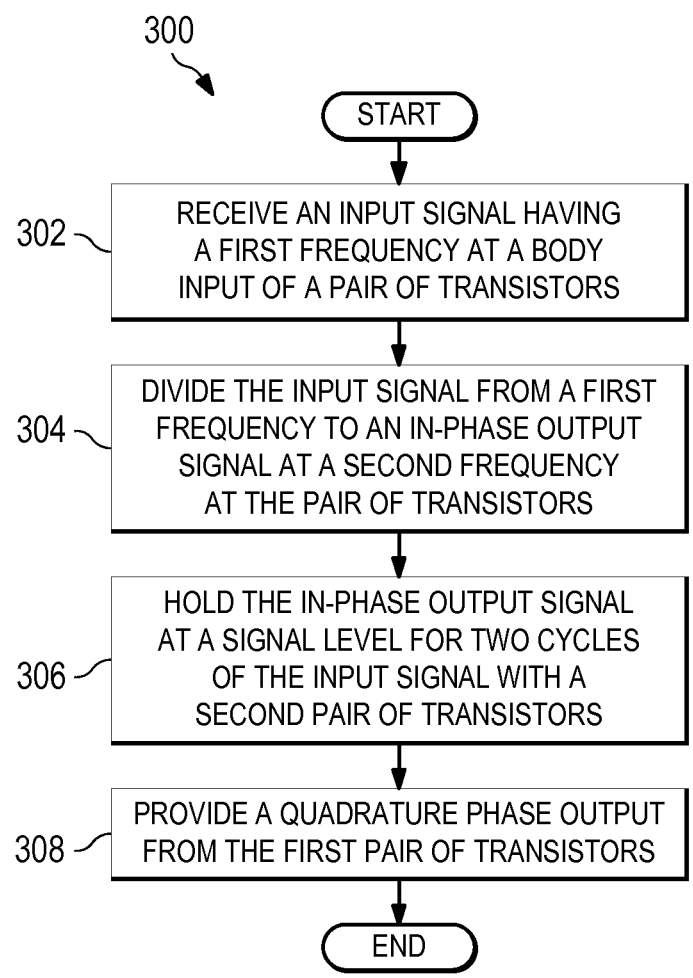
FIG. 3 is a flow chart illustrating an exemplary method of dividing an input signal according to one embodiment of the disclosure.

FIG. 3 is a flow chart illustrating an exemplary method 300 of dividing an input signal according to one embodiment of the disclosure. A method 300 for dividing an input signal begins at block 302 with receiving an input signal having a first frequency at a body input of a pair of transistors. For example, an input signal may be applied to the input node 102 of FIG. 1, which is coupled to a body terminal of the transistor 114a and the transistor 114b. Applying the input signal to the body terminal of the transistors 114a-b allows the division process to be accomplished in the voltage domain, without first performing current commuting At block 304, the input signal is divided from a first frequency to an in-phase output signal at a second frequency at the pair of transistors. The pair of transistors 114a-b divide the signal creating an in-phase output signal at the output nodes 152a and 152b of FIG. 1.

At block 306, the in-phase output signal is held at a signal level with a second pair of transistors. The transistors 112a and 112b of FIG. 1 coupled to the output nodes 152a and 152b hold the output of the in-phase output nodes 152a and 152b for two clock cycles of the input signal. Thus, the output signal at the in-phase output nodes 152a and 152b have a frequency approximately half that of the input signal received at the input nodes 102p and 102n.

At block 308, a quadrature phase output is provided from the first pair of transistors. The transistors 114a and 114b of FIG. 1 also may also provide a quadrature phase output at the output nodes 152c and 152d.

Figure 4:
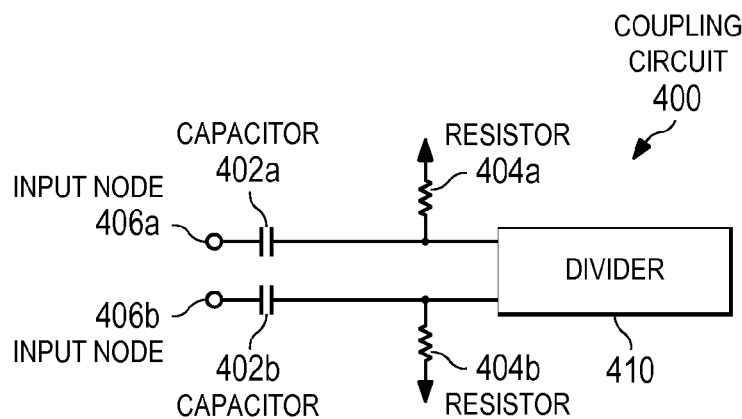
FIG. 4 is a block diagram illustrating capacitive coupling of an input signal with a frequency divider circuit according to one embodiment of the disclosure.

The input signals to the frequency divider circuit may be coupled to the transistors of the frequency divider circuit through a capacitive coupling circuit. FIG. 4 is a block diagram illustrating capacitive coupling of input nodes 406a-b with a frequency divider circuit 410 according to one embodiment of the disclosure. A capacitive coupling circuit 400 may include a frequency divider 410, such as the divider circuit of FIG. 1 or FIG. 2 described above. The capacitive coupling circuit 400 may include capacitors 402a-b and resistors 404a-b. In the case of a differential input signal coupled to the frequency divider 410, the capacitive coupling circuit 400 may include an input node 406a coupled to the capacitor 402a and the resistor 404a, and an input node 406b coupled to the capacitor 402b and the resistor 404b.

Figure 5A:
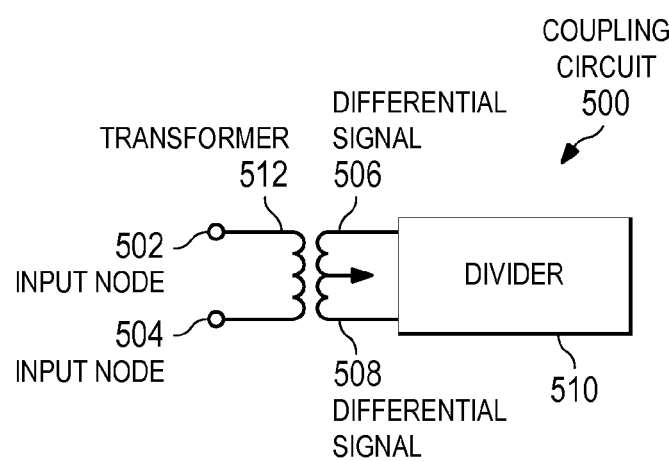
FIG. 5A is a block diagram illustrating inductive coupling of an input signal with a frequency divider circuit according to one embodiment of the disclosure.

The input signals to the frequency divider may also be coupled to the transistors of the frequency divider through an inductive coupling circuit 500. FIG. 5A is a block diagram illustrating inductive coupling of an input signal with a frequency divider circuit according to one embodiment of the disclosure. An inductive coupling circuit 500 may include a frequency divider 510, such as the divider circuit of FIG. 1 or FIG. 2 described above. The inductive coupling circuit 500 may include a transformer 512. The transformer 512 may receive a differential input through inputs nodes 502 and 504 and output a differential signal 506 and 508 to the frequency divider 510. The inductive coupling circuit 500 may reduce variance in the final product due to manufacturing processes. Additionally, the decreased resistance of the inductive coupling circuit 500 may reduce noise generated in the signal before the signal reaches the frequency divider. According to another embodiment, the inductive coupling may be magnetic coupling.

Figure 5B:
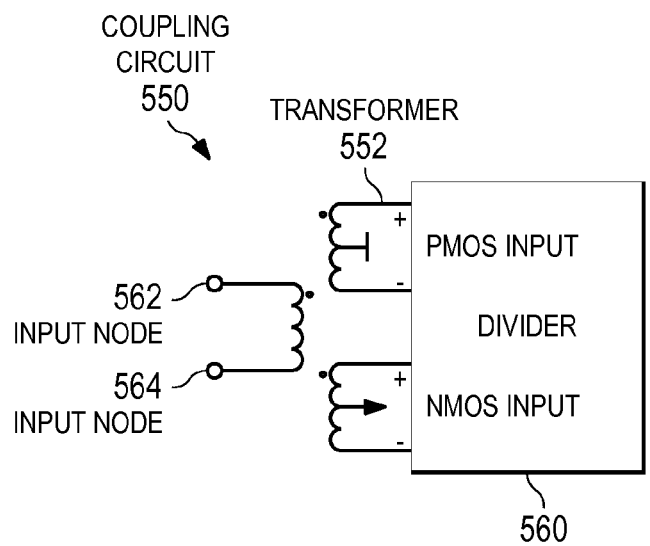
FIG. 5B is a block diagram illustrating inductive coupling of an input signal with a frequency divider circuit according to another embodiment of the disclosure.

According to one embodiment, input signals may be coupled to both PMOS and NMOS transistors in a divider circuit as shown in FIG. 5. An alternate inductive coupling circuit 550 may be provided to allow different biasing for the PMOS and NMOS transistors of the divider circuit. FIG. 5B is a block diagram illustrating inductive coupling of input nodes 562-564 with a frequency divider circuit 560 according to another embodiment of the disclosure. A coupling circuit 550 may include a multi-tap transformer 552 coupled to a frequency divider circuit 560. The transformer 552 may be coupled to PMOS transistors and NMOS transistors of the frequency divider circuit 560 and provide different outputs to the PMOS and NMOS transistors through taps to the transformer 552. The transformer 552 may receive a differential signal through input nodes 562-564 for coupling to the divider circuit 560.

Input signals may be coupled to the body of transistors in the first stage and the second stage. FIG. 6 is a circuit schematic of a frequency divider circuit 600 having input nodes 602p and 604p coupled to PMOS transistors 612a-b and NMOS transistors 614a-b according to one embodiment of the disclosure. A circuit 600 includes a first latch 610 and a second latch 620. The first latch 610 may include a first stage 612 and a second stage 614. The first stage 612 may include transistors 612a-b, which may be PMOS transistors. The second stage 614 may include transistors 614a-b, which may be NMOS transistors. Input node 602p may be coupled to a body of the PMOS transistors 612a-b. The input node 604p may also be coupled to a body of the NMOS transistors 614a-b. The latch 620 may be a duplicate of the latch 610, but is coupled to an input node 604n and 602n. The input nodes 602n and 604n may receive components of a differential input signal.

The transistors 612a-b may be cross-coupled. For example, a gate terminal of the transistor 612a may be coupled to a source/drain terminal of the transistor 612b and the transistor 614b, and a gate terminal of the transistor 612b may be coupled to a source/drain terminal of the transistor 612a and the transistor 614a. A supply voltage 630 may be provided at a source/drain terminal of the transistors 612a-b. A frequency divided output may be provided from the circuit 600 at output nodes 632a-d. The output nodes 632a-b provide in-phase output, and the outputs 632c-d provide quadrature output.

Figure 7:
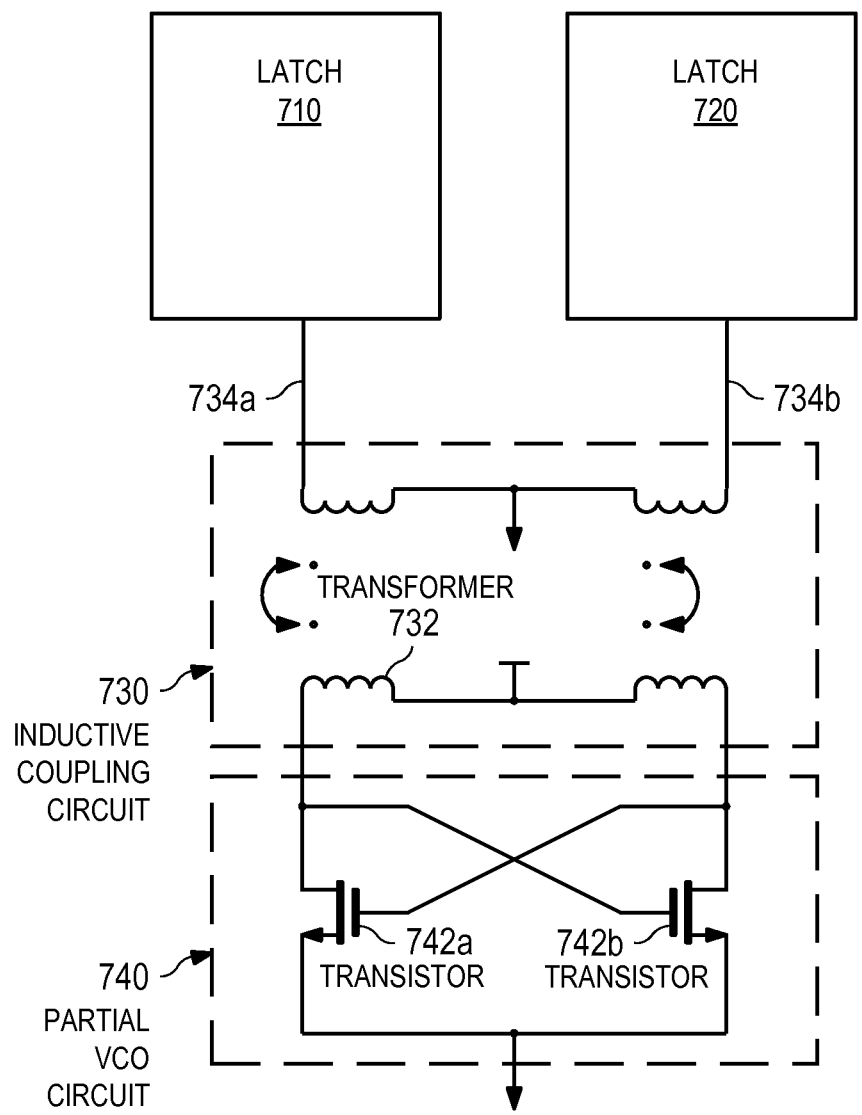
FIG. 7 is a circuit schematic of a frequency divider circuit with a voltage controlled oscillator (VCO) according to one embodiment of the disclosure.

A frequency divider such as those described above in FIGS. 1, 2, and 6 may be combined with a portion of a voltage controlled oscillator (VCO) with a configuration according to FIG. 5 through coupling circuits illustrated in FIGS. 5A and 5B. FIG. 7 is a circuit schematic of a frequency divider circuit coupled to a portion of a VCO circuit according to one embodiment of the disclosure. A circuit 700 includes a first latch 710 and a second latch 720. The circuit 700 may be configured similar to the circuit 100 of FIG. 1. However, any frequency divider circuit, including those illustrated in FIGS. 2 and 6, may be combined with at least a portion of a VCO circuit as shown in FIG. 7.

Input signals at input nodes 734a-b may be produced from an inductive coupling circuit 730. The inductive coupling circuit 730 may include a transformer 732. The input signals at the input nodes 734a-b to the latches 710 and 720, respectively, may be produced from the inductive coupling circuit 730. According to one embodiment, the output nodes 734a-b may be coupled to the body of transistors of the latches 710 and 720, respectively. The inductive coupling circuit 730 may be coupled to a portion of a VCO circuit 740. The VCO circuit portion 740 may include cross-coupled transistors 742a-b.

The circuit 700 performs frequency division on the output of the VCO circuit portion 740. Although inductive coupling between the VCO circuit portion 740 and the latches 710, 720 is shown in FIG. 7, capacitive coupling may alternatively couple the VCO circuit portion 740 to the latches 710, 720, such as through a capacitive coupling circuit shown in FIG. 4.

FIG. 8 is a block diagram showing an exemplary wireless communication system 800 in which an embodiment of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C and 825B that include a frequency divider circuit such as a divider circuit 802 or other circuitry as illustrated in FIGS. 1-7. It will be recognized that any device containing an IC may also include the frequency divider circuit disclosed here, including the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 8 illustrates remote units according to the teachings of the disclosure, the disclosure is not limited to these exemplary illustrated units. Embodiments of the disclosure may be suitably employed in any device which includes a memory device.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present invention.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus for dividing an input signal from one frequency to another frequency, the apparatus comprising:
   a first latch and a second latch, each of the first latch and the second latch comprising a cross-coupled pair of transistors and a non-cross-coupled pair of transistors; and
   a first input node and a second input node for receiving the input signal,
   wherein the first input node is coupled to body terminals but not source terminals of the non-cross-coupled pair of transistors in the first latch, and the second input node is coupled to body terminals but not source terminals of the non-cross-coupled pair of transistors in the second latch.

2. The apparatus of claim 1, further comprising
   a third input node and a fourth input node,
   wherein the third input node is coupled to body terminals of the cross-coupled pair of transistors in the first latch, and the fourth input node is coupled to body terminals of the cross-coupled pair of transistors in the second latch.

3. The apparatus of claim 2, further comprising
   an inductive coupling circuit coupled to the input signal,
   wherein the inductive coupling circuit comprises at least a first output tap and a second output tap.

4. The apparatus of claim 3, wherein the first output tap is coupled to the first and second input nodes and the second output tap is coupled to the third and fourth input nodes.

5. The apparatus of claim 1, further comprising
   a first output node and a second output node each coupled to drain terminals of the cross-coupled pair of transistors and the non-cross-coupled pair of transistors in the first latch; and
   a third output node and a fourth output node each coupled to drain terminals of the cross-coupled pair of transistors and the non-cross-coupled pair of transistors in the second latch.

6. The apparatus of claim 5, wherein the first, second, third, and fourth output nodes receive an in-phase output signal which is in phase with the input signal, but at approximately half of the frequency of the input signal.

7. The apparatus of claim 5, further comprising
   a fifth output node and a sixth output node each coupled to gate terminals of the non-cross-coupled pair of transistors in the first latch; and
   a seventh output node and an eighth output node each coupled to gate terminals of the non-cross-coupled pair of transistors in the second latch.

8. The apparatus of claim 7, wherein the fifth, sixth, seventh, and eighth output nodes receive a quadrature-phase output signal which is in a quadrature phase with the input signal, but at approximately half of the frequency of the input signal.

9. The apparatus of claim 1, wherein the first input node is a positive terminal and the second input node is a negative terminal.

10. The apparatus of claim 1, wherein the apparatus is integrated into at least one of a mobile phone, a set top box, a music player, a video player, an entertainment unit, a navigation device, a computer, a hand-held personal communication systems (PCS) unit, a portable data unit, and a fixed location data unit.

11. An apparatus for dividing an input signal, the apparatus comprising:
    means for receiving the input signal of a first frequency at a first input node and a second input node;
    means for dividing the input signal from the first frequency to a second frequency using a divider circuit comprising:
    a first latch and a second latch, each of the first latch and the second latch comprising a cross-coupled pair of transistors and a non-cross-coupled pair of transistors,
    wherein the first input node is coupled to body terminals but not source terminals of the non-cross-coupled pair of transistors in the first latch, and the second input node is coupled to body terminals but not source terminals of the non-cross-coupled pair of transistors in the second latch.

12. The apparatus of claim 11, further comprising
    means for generating an in-phase output signal, which is in phase with the input signal, at drain terminals of the cross-coupled pair of transistors and the non-cross-coupled pair of transistors in the first latch and the second latch.

13. The apparatus of claim 11, further comprising
    means for generating a quadrature output signal, which is in quadrature phase with the input signal, at gate terminals of the non-cross-coupled pair of transistors in the first latch and the second latch.

14. The apparatus of claim 11, wherein means for receiving the input signal comprises
    means for inductively coupling the input signal to a first output tap and a second output tap.

15. The apparatus of claim 14, further comprising
    means for coupling the first output tap to the body terminals of the non-cross-coupled pair of transistors in the first latch and the second latch.

16. The apparatus of claim 14, further comprising
    means for coupling the second output tap to the body terminals of the cross-coupled pair of transistors in the first latch and the second latch.

17. A method for dividing an input signal, the method comprising:
    receiving the input signal of a first frequency at a first input node and a second input node;
    dividing the input signal from the first frequency to a second frequency using a divider circuit comprising:
    a first latch and a second latch, each of the first latch and the second latch comprising a cross-coupled pair of transistors and a non-cross-coupled pair of transistors,
    wherein the first input node is coupled to body terminals but not source terminals of the non-cross-coupled pair of transistors in the first latch, and the second input node is coupled to body terminals but not source terminals of the non-cross-coupled pair of transistors in the second latch.

18. The method of claim 17, further comprising
    generating an in-phase output signal, which is in phase with the input signal, at drain terminals of the cross-coupled pair of transistors and the non-cross-coupled pair of transistors in the first latch and the second latch.

19. The method of claim 17, further comprising
generating a quadrature output signal, which is in quadrature phase with the input signal, at gate terminals of the non-cross-coupled pair of transistors in the first latch and the second latch.

20. The method of claim 17, wherein receiving the input signal comprises
inductively coupling the input signal at the first and second input nodes to the body terminals of the non-cross-coupled pair of transistors in the first latch and the second latch.

21. The method of claim 17, wherein each of the cross-coupled pair of transistors and the non-cross-coupled pair of transistors comprising one of: (1) at least two NMOS transistors, or (2) at least two PMOS transistors.

* * * * *